(12) United States Patent
Drouin et al.

(10) Patent No.: US 6,897,140 B2
(45) Date of Patent: May 24, 2005

(54) FABRICATION OF STRUCTURES OF METAL/SEMICONDUCTOR COMPOUND BY X-RAY/EUV PROJECTION LITHOGRAPHY

(75) Inventors: Dominique Drouin, Deauville (CA); Eric Lavallée, Sherbrooke (CA); Jacques Beauvais, Sherbrooke (CA)

(73) Assignee: Quantiscript, Inc., Sherbrooke (CA)

( * ) Notice: Subject to any disclaimer, the term of this patent is extended or adjusted under 35 U.S.C. 154(b) by 0 days.

(21) Appl. No.: 10/467,148

(22) PCT Filed: Feb. 5, 2001

(86) PCT No.: PCT/CA01/00129

§ 371 (c)(1),
(2), (4) Date: Jan. 30, 2004

(87) PCT Pub. No.: WO02/063394

PCT Pub. Date: Aug. 15, 2002

(65) Prior Publication Data

US 2004/0115960 A1 Jun. 17, 2004

(51) Int. Cl.[7] .............................................. H01L 21/44
(52) U.S. Cl. ........................ 438/607; 438/660; 438/682
(58) Field of Search ................................ 438/607, 660, 438/682

(56) References Cited

U.S. PATENT DOCUMENTS 6,261,938 B1 * 7/2001 Beauvais et al. ........... 438/607
6,514,877 B1 * 2/2003 Beauvais et al. ........... 438/763

FOREIGN PATENT DOCUMENTS

| JP | 57157249 | 9/1982 |
|----|----------|--------|
| JP | 62055928 | 3/1987 |
| WO | 0017710 | 3/2000 |

OTHER PUBLICATIONS

Canning, "Potentials and challenges for lithography beyond 193 nm optics," J. Vac. Sci. Technol. B 15 (6), Nov./Dec. 1997, pp. 2109–2111.

(Continued)

Primary Examiner—Luan Thai
(74) Attorney, Agent, or Firm—Kirkpatrick & Lockhart Nicholson Graham LLP

(57) ABSTRACT

A lithography method for fabricating structures of etch-resistant metal-semiconductor compound on a substrate with sub-micrometer scale resolutions is described. Superposed layers of metal and semiconductor capable of reacting with each other to form etch-resistant metal/semiconductor compound are deposited on the substrate. Radiation from a X-ray/EUV source propagates through a patterned X-ray transparent/EUV reflective mask and is projected on the superposed metal and semiconductor layers. The X-ray transparent mask includes X-ray absorbing patterns imparted to the X-ray radiation while the EUV reflective mask includes EUV absorbing patterns also imparted to the EUV radiation. The energy of X-ray/EUV photons is absorbed locally by the metal and semiconductor layers. Absorption of this energy induces a reaction between the two layers responsible for the formation of etch-resistant metal/semiconductor compound with structures corresponding to the patterns imparted to the radiation by the X-ray/ EUV mask. The metal layer is subsequently etched using selective plasma or wet etching, leaving the structures of etch-resistant metal/semiconductor compound intact. The semiconductor layer may also be etched using selective plasma or wet etching, also leaving the structures of etch-resistant metal/semiconductor compound intact. The underlying layers of the substrate may also be partially or completely etched away using selective plasma or wet etching. Again, the structures of etch resistant metal/semiconductor compound protects the substrate against etching whereby these structures form corresponding patterns in the underlying layers of the substrate.

22 Claims, 5 Drawing Sheets

OTHER PUBLICATIONS

Deng et al., "Salicidation process using NiSi and its device application," J. Appl. Phys., 81 (12) 1997, pp. 8047–8051.

Drouin et al., "Method for fabricating submicron silicide structures on silicon using a resistless electron beam lithography process," Appl. Phys. Lett. 70 (22), Jun. 2, 1997, pp. 3020–3022.

Gwyn et al., "Extreme ultraviolet lithography," J. Vac. Sci. Technol. B 16 (6), Nov./Dec. 1998, pp. 3142–3149.

Hoshino et al., "Study of removal process for buffer layer on multilayer of EUVL mask," Proceedings of the 17th European Mask Conference in Munich, Nov. 13–14, 2000, pp. 27–31.

Michel et al., "Salicidation process for submicrometre gate MOSFET fabrication using a resistless electron beam lithography process," Electronics Letters, 35 (15), Jul. 22, 1999, pp. 1283–1284.

Silverman, "Challenges and progress in X–ray lithography," J. Vac. Sci. Technol. B 16 (6), Nov./Dec. 1998, pp. 3137–3141.

Yamada et al., "Process technologies for Ta/SiC X–ray masks," J. Electrochem. Soc. 137 (7), Jul. 1990, pp. 2231–2242.

* cited by examiner

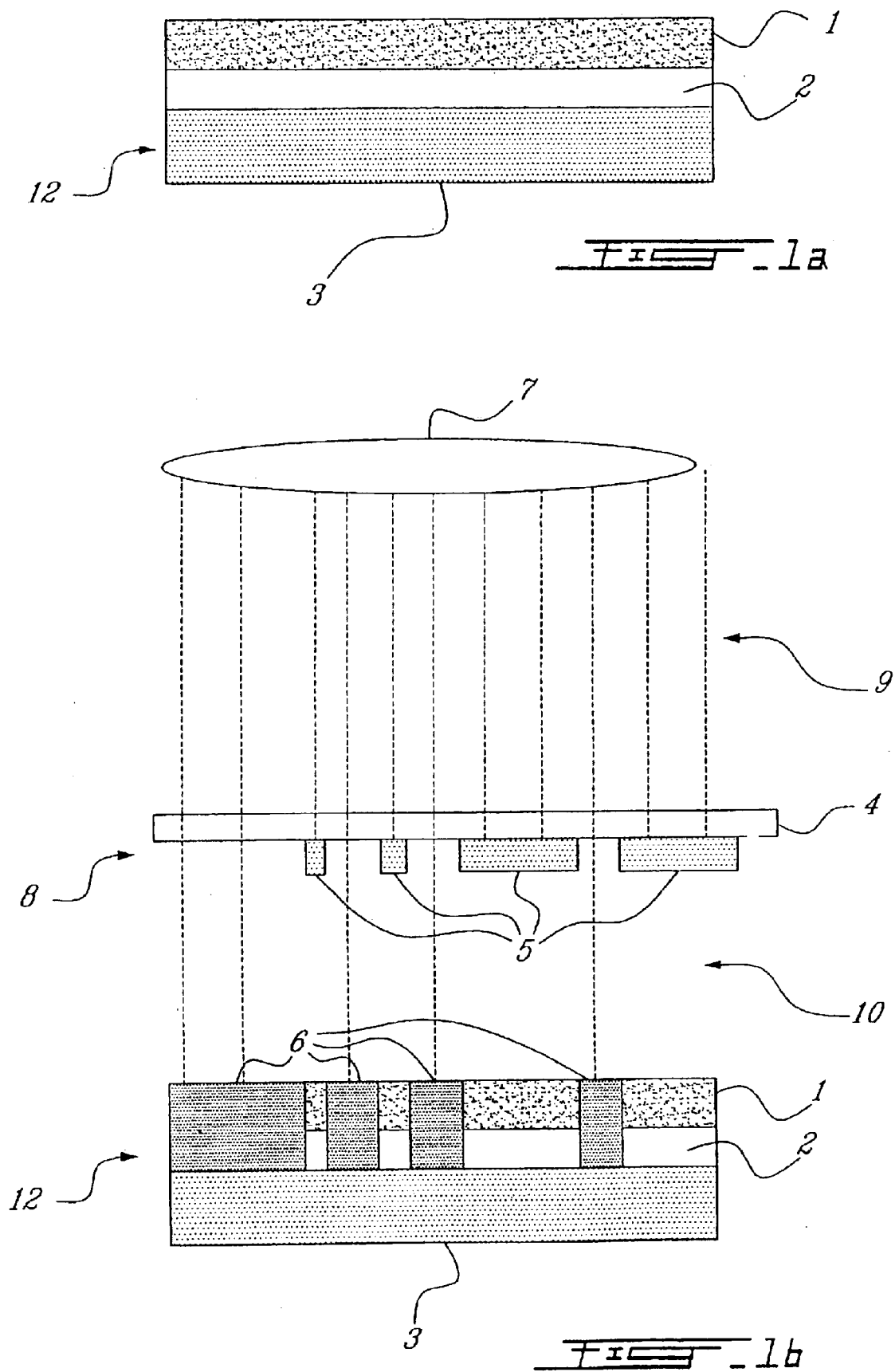

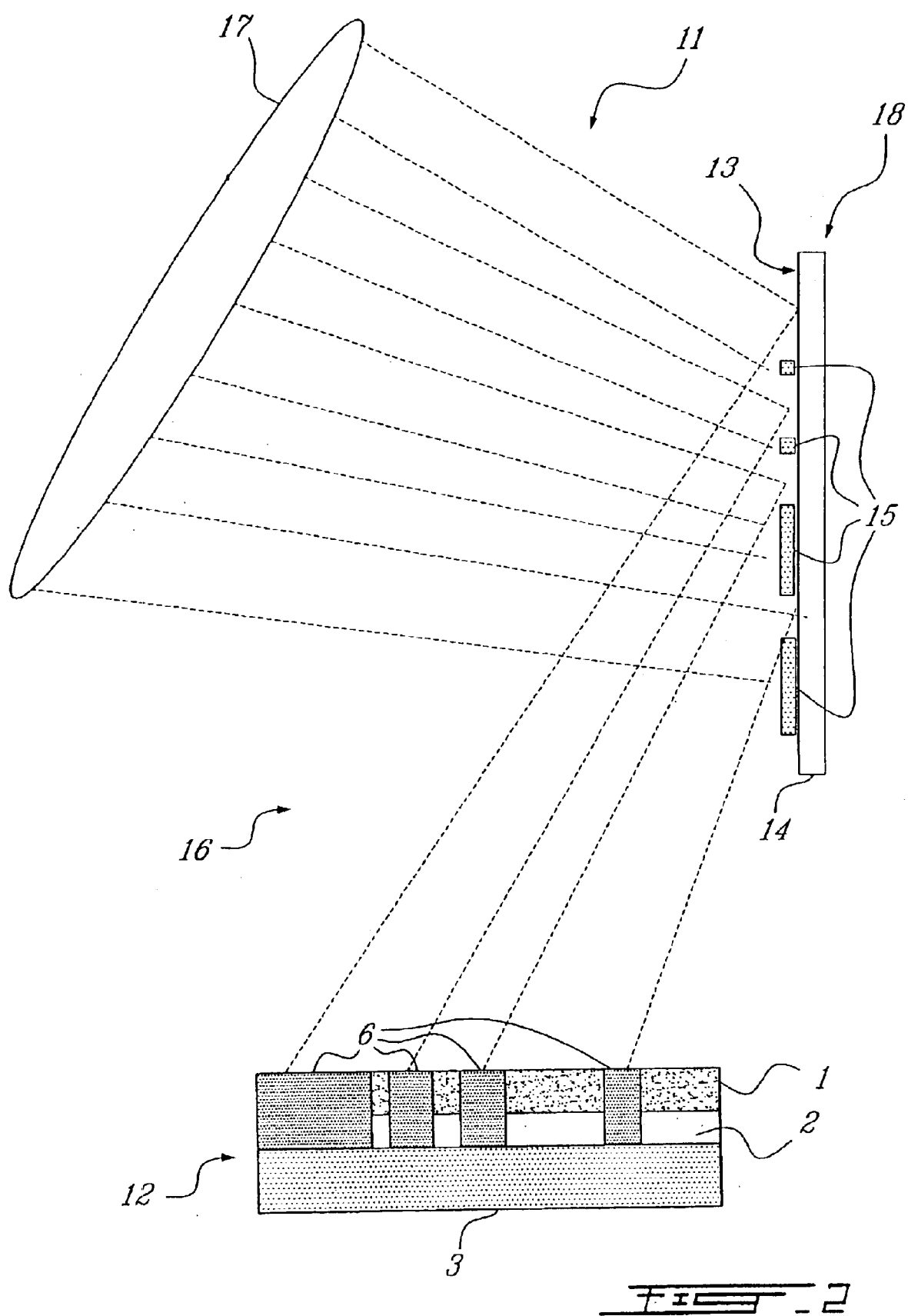

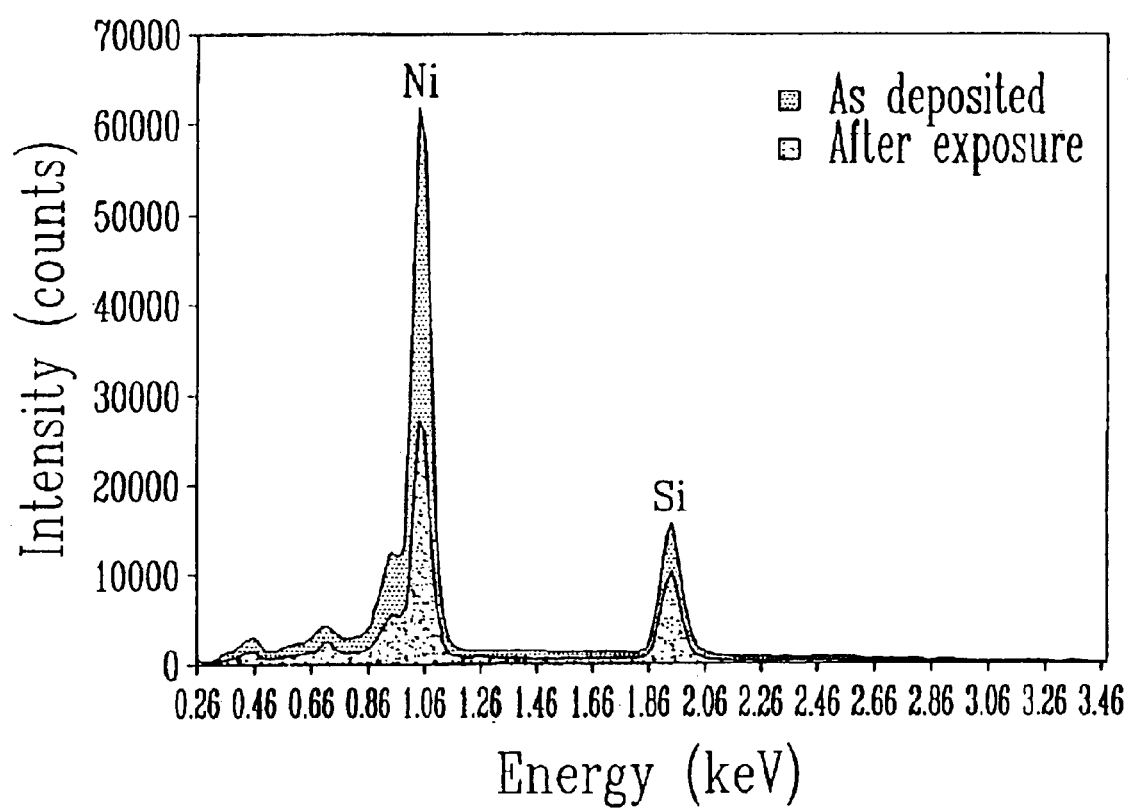
FIG_4

FABRICATION OF STRUCTURES OF METAL/SEMICONDUCTOR COMPOUND BY X-RAY/EUV PROJECTION LITHOGRAPHY

CROSS-REFERENCE TO RELATED APPLICATION

This application is the national phase of International (PCT) Patent Application Ser. No. PCT/CA01/00129, filed Feb. 5, 2001, published under PCT Article 21(2) in English, the disclosures of which are herein incorporated by reference.

BACKGROUND OF THE INVENTION

1. Field of the Invention

The present invention relates to a method for fabricating structures of etch-resistant metal/semiconductor compound on a substrate through, in particular but not exclusively, X-ray or extreme ultraviolet (EUV) lithography.

2. Brief Description of the Prior Art

Due to the predicted diminution of the critical dimension in integrated circuits, deep ultraviolet lithography will be replaced as the main lithographic tool for industrial production within five years ["Potentials and challenges for lithography beyond 193 nm optics" John Canning, J. Vac. Sci. Technol. B 15(6), November/December 1997, pp. 2109–2111]. X-ray lithography and EUV lithography are potential replacement technologies which both use light to transfer patterns from a mask to a wafer on which an integrated circuit is fabricated.

In the case of X-ray lithography, one of the major areas of concern is the difficulty to produce masks with sufficient resolution and with no defects. Also, these masks will be submitted, during production, to a large amount of thermal stresses caused by the absorption of the X-rays ["Process technologies for Ta/SiC X-ray masks", M. Yamada, K. Kondo, M. Nakaishi, J. Kudo, K, Sugishima, J. Electrochem. Soc. 137 (7), July 1990, pp. 2231–2242]. The ability to produce a mask with high resolution has already been demonstrated by electron beam lithography ["Challenges and progress in X-ray lithography" Jerome P. Silverman, J. Vac. Sci. Technol. B 16(6), November/December 1998, pp. 3137–3141]. However, the throughput of mask production is limited by the high quality criteria that each mask has to fulfill and by the limited speed of electron beam lithography. To increase the throughput of mask production, one strategy would be to copy an original mask made by electron beam lithography. X-ray lithography generally uses conventional photon-sensitive resists to transfer the patterns from the mask to a wafer, and these resists are not suitable for sub-100 nm pattern transfer to a thick layer of absorber with vertical sidewalls such as needed for mask copying. This is mainly due to the poor resistance of those resists to plasma etching. In turn, the ability of structures of silicide or other metal/semiconductor compound to adequately protect an absorbent layer during plasma etching has already been demonstrated in relation to electron beam lithography ["Method for fabricating submicron silicide structures on silicon using a resistles lectron beam lithography process" D. Drouin, J. Beauvais, R. Lemire, E. Lavallee, R. Gauvin, M. Caron, Appl. Phys. Lett. 70 (22), 2 Jun. 1997, pp. 3020–3022; and "Fabrication of sub-micron silicide structures on silicon using resistless electron beam lithography" J. Beauvais, D. Drouin, E. Lavallee, U.S. Pat. No. 5,918,143, 29 Jun. 1999].

The same kind of absorbent as for X-ray lithography masks are being considered for EUV lithography masks ["Extreme ultraviolet lithography", C. W. Gwyn, R. Stulen, D. Sweeney, D. Attwood, J. Vac. Sci. Technol. B, 16 (6), November/December 1998, pp. 3142–3149]. The wavelengths being considered for EUV lithography are of the order of 10–20 nm, which requires for adequate absorption a thickness of approximately 100 nm of metal. This absorbent is spaced apart by a buffer layer, typically a 50 nm thick layer of $SiO_2$ or SiON. In the case of EUV, one of the critical issues is the ability to etch the absorbent and the buffer layer with vertical sidewalls and achieve identical effective widths for both layers ["Study of removal process for buffer layer on multilayer of EUVL mask", E. Hoshino, T. Ogawa, M. Takahashi, H. Hoko, H. Yamanashi, N. Hirano, A. Chiba, B-T Lee, M. Ito, S. Okazaki, Prooceedings of the $17^{th}$ European Mask Conference in Munich, 13–14 November 2000, pp. 27–317]. This requires a great level of chemical selectivity between both etches used to transfer the patterns to the absorbent and the buffer layer.

Another application of structures of silicide or other metal/semiconductor compound in microelectronics is the fabrication of transistor gates having a low electrical resistivity. Previously, the fabrication of transistor gates was limited in speed by the electron beam lithography processes used to form the silicide or other metal/semiconductor compound ["Salicidation process for submicrometre gate MOSFET fabrication using a resistless electron beam lithography process" S. Michel, E. Lavallee, J. Beauvais, J. Mouine, Electronics Letters, 35 (14), 22 Jul. 1999, pp. 1283–1284] or in resolution by the patterning of the gate ["Salicidation process using NiSi and its device application" F. Deng, R. A. Johnson, P. M. Asbeck, S. S. Lau, W. B. Dubbelday, J. Appl. Phys., 81 (12), 1997, pp. 8047–8051]. To overcome these limitations, a high resolution projection lithographic technique is required. The direct formation of silicide or other metal/semiconductor compound by X-rays or EUV meets with these requirements.

OBJECT OF THE INVENTION

An object of the present invention is therefore to overcome the above described drawbacks of the prior art.

Another object of the present invention is to replace the polymeric or organic resists of the prior art by structures of metal/semiconductor compound.

SUMMARY OF THE INVENTION

More specifically, in accordance with the present invention, there is provided a lithography method for fabricating on a substrate structures of etch-resistant metal/semiconductor compound, in which superposed layers of metal and semiconductor capable of reacting with each other to form the etch-resistant metal/semiconductor compound are deposited on the substrate. Radiation is produced through a radiation source and a mask defining radiation-absorbing patterns is interposed between the radiation source and the superposed metal and semiconductor layers. The radiation is propagated from the source to the mask where the patterns absorb radiation and, therefore, the patterns are imparted to the radiation. The patterned radiation is propagated from the mask to the superposed metal and semiconductor layers. Energy of the patterned radiation is absorbed locally by the metal and semiconductor layers to (a) induce the reaction between the metal and semiconductor responsible for the formation of etch-resistant metal/semiconductor compound, and (b) thereby produce the structures of etch-resistant metal/semiconductor compound corresponding to the patterns imparted to the radiation.

The radiation may be X-ray or EUV radiation.

In a resistless lithography method of the above type, the use of X-ray or EUV radiation enables the production of patterned structures of etch-resistant metal/semiconductor compound with high resolution of the order of the shorter of the thickness of the metal layer and the wavelength of the X-ray or EUV photons.

In accordance with preferred embodiments of the lithography method according to the invention:

Depositing the metal and semiconductor layers comprises depositing the semiconductor layer on the substrate, and depositing the metal layer on the semiconductor layer.

Depositing the metal and semiconductor layers comprises depositing the metal layer on the substrate, and depositing the semiconductor layer on the metal layer.

The mask comprises a substrate transparent to the radiation and including the radiation-absorbing patterns, and the lithography method comprises propagating the radiation through the radiation transparent substrate.

The mask comprises a radiation reflective substrate including the radiation-absorbing patterns, and the method comprises reflecting the radiation from the source on the radiation reflective substrate toward the metal and semiconductor layers.

The radiation is a X-ray radiation, the mask comprises a X-ray transparent substrate including X-ray absorbing patterns, and the lithography method comprises propagating the X-ray radiation through the X-ray transparent substrate.

The radiation is an EUV radiation, the mask comprises an EUV reflective substrate including EUV absorbing patterns, and the lithography method comprises reflecting the EUV radiation from the source on the EUV reflective substrate toward the metal and semiconductor layers.

The semiconductor is selected from the group consisting of silicon, germanium, a combination of silicon and germanium, gallium, arsenic, aluminium, phosphor, indium, and any combination of gallium, arsenic, aluminium, phosphor and indium.

The metal is selected from the group consisting of titanium, zirconium, hafnium, vanadium, niobium, tantalum, chromium, molybdenum, tungsten, manganese, iron, cobalt, rhodium, iridium, nickel, palladium, platinum, copper, silver, zinc, and cadmium.

The substrate is made of a material selected from the group consisting of tantalum, polycrystalline silicon, chromium or any other suitable metal, semiconductor material, insulator material or a combination thereof.

The semiconductor comprises silicon, and the metal/semiconductor compound comprises silicide.

The lithography method comprises etching the metal layer while leaving the structures of etch-resistant metal/semiconductor compound intact, and etching the semiconductor layer while leaving the structures of etch-resistant metal/semiconductor compound intact.

The lithography method further comprises etching through at least a portion of the thickness of the substrate except in regions protected by the structures of etch-resistant metal/semiconductor compound to thereby transfer the patterns from the structures of etch-resistant metal/semiconductor compound to the substrate.

The substrate comprises a plurality of layers, and the lithography method further comprises etching through at least one layer of the substrate except in regions protected by the structures of etch-resistant metal/semiconductor compound to thereby transfer the patterns from the structures of etch-resistant metal/semiconductor compound to said at least one layer of the substrate.

Etching comprises wet or plasma etching.

Applications of the present invention include copying of a mask for X-ray lithography; copying of a mask for EUV lithography; the fabrication of elements of an integrated circuit through direct formation of conductive metal/semiconductor compound patterns on the integrated circuit; and micro-machining of three dimensional electrical and mechanical components.

The foregoing and other objects, advantages and features of the present invention will become more apparent upon reading of the following non restrictive description of preferred embodiments thereof, given for the purpose of illustration only with reference to the accompanying drawings.

BRIEF DESCRIPTION OF THE DRAWINGS

In the appended drawings:

FIG. 1a is a side elevational view of a substrate on which layers of semiconductor and metal have been deposited;

FIG. 1b is a side elevational view of the substrate with the semiconductor and metal layers of FIG. 1a, exposed to X-ray radiation through a mask;

FIG. 2 illustrates an alternative to the lithography set-up of FIG. 1b, for processing the substrate with semiconductor and metal layers of FIG. 1a, in which the X-ray radiation source is replaced by an EUV radiation source;

FIG. 4 is graph presenting a X-ray micro-analysis of the composition of suicide structures formed by exposing to X-rays a nickel layer applied to a silicon layer.

DETAILED DESCRIPTION OF THE PREFERRED EMBODIMENTS

Figure 1C:
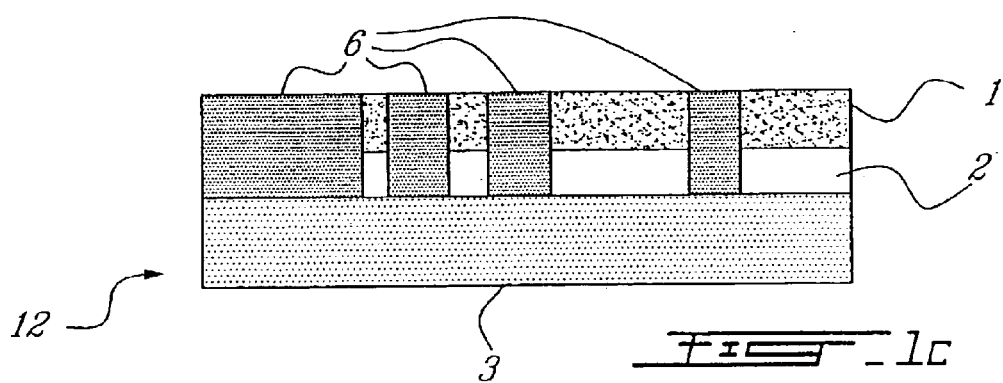
FIG. 1c is a side elevational view of the substrate with the semiconductor and metal layers of FIGS. 1a and 1b after exposure to the X-ray radiation, showing structures of metal/semiconductor compound formed in the areas previously exposed to X-rays.

In the different figures of the appended drawings, the corresponding elements are identified by the same reference numerals.

Appended FIGS. 1a, 1b, 1c, 1d, 1e and 1f illustrate the various steps of a preferred embodiment of the method according to the present invention, for fabricating structures 6 of metal/semiconductor compound on a substrate 3.

Generally speaking, the method illustrated in FIGS. 1a, 1b, 1c, 1d, 1e and 1f uses a X-ray lithography source 7 (FIG. 1b) to produce X-ray radiation 9. The X-ray radiation 9 propagates through a mask 8 made of X-ray absorbing patterns 5 on a X-ray transparent substrate 4. The mask 8 reproduces the patterns 5 in the X-ray radiation 10 propagating from the mask 8 to the sample 12 made of a substrate 3, a semiconductor layer 2 and a metal layer 1. The patterned X-ray radiation 10 forms structures 6 of metal/semiconductor compound at the interface of the metal layer 1 and the semiconductor layer 2.

More specifically, the preferred embodiment of the method according to the invention, for fabricating structures 6 of metal/semiconductor compound, formed for example of ultra-narrow lines of metal/semiconductor compound onto the substrate 3, can be summarized as follows:

FIG. 1a:

A layer 2 of semiconductor is first deposited on a previously cleaned substrate 3. A layer 1 of metal capable of reacting with the semiconductor to form metal/semiconductor compound is then deposited on the semiconductor layer 2. As a non limitative example, an electron beam evaporation technique or a sputtering technique in a low vacuum chamber can be used for depositing both layers 1 and 2.

The substrate 3 can be made of tantalum, polycrystalline silicon, chromium or any other suitable metal, semiconductor material, insulator material or a combination thereof.

Layer 1 can be made of metals such as titanium, zirconium, hafnium, vanadium, niobium, tantalum, chromium, molybdenum, tungsten, manganese, iron, cobalt, rhodium, iridium, nickel, palladium, platinum, copper, silver, zinc, cadmium, or any other metal or metal alloy with absorbent properties in regard to X-ray or EUV photons used in the photolithography operation, or a combination of the foregoing metals.

In this preferred embodiment, the layer 2 of semiconductor is made of silicon, and the metal/semiconductor compound which is formed is silicide. However, it is within the scope of the present invention to use a layer 2 made of germanium, a combination of silicon and germanium, gallium, arsenic, aluminium, phosphor, indium, or any combination of gallium, arsenic, aluminium, phosphor and indium.

FIG. 1b:

The X-ray lithography source 7 produces X-ray radiation 9. The mask 8 made of the X-ray transparent substrate 4 with X-ray absorbing patterns 5 is interposed between the source 7 and the sample 12 consisting of the substrate 3 with the silicon 2 and metal 1 layers. The X-ray radiation 9 from the source 7 propagates through the mask 8 to produce the patterned X-ray radiation 10. More specifically, the X-ray radiation 9 from the source 7 propagates through the X-ray transparent substrate 4 but is absorbed by the X-ray absorbing patterns 5. Absorption of the X-ray radiation by the patterns 5 imparts these patterns 5 to the X-ray radiation 10.

The patterned X-ray radiation 10 is projected onto the layer 1 of metal to alloy the silicon 2 and metal 1 layers. To induce this reaction, the metal of the layer 1 partly absorbs the X-ray radiation from the mask 8. And the energy of these partly absorbed X-rays produces a diffusion of the metal 1 and silicon 2 layers in each other to form the structures 6 of silicide. Of course, the structures 6 of silicide correspond to the patterns 5 of the mask 8 reproduced in the X-ray radiation 10.

FIG. 1c:

The areas of the metal 1 and silicon 2 layers exposed to X-rays have been converted to structures 6 of silicide due to the above mentioned diffusion of the metal 1 and silicon 2 layers in each other.

FIG. 1d:

The sample 12 of FIG. 1c is immersed in an acid solution or processed in a plasma etching system for etching the metal layer 1 while leaving the structures 6 of suicide intact. The proper acid solution or gas plasma to perform this task depends on the nature of the metal layer 1. In the case of a nickel layer, a solution of $HNO_3:CH_3CHOHCH_3:H_2O$ can be used as etching acid solution. In the case of a chromium layer, a solution of $HClO_4:H_2O:(NH_4)_2Ce(NO_3)_6$ can be used as etching acid solution. In the case of a platinum layer, an aqua regia solution ($HNO_3:HCl:H_2O$) is a proper acid solution. A plasma from a $Cl_2$ $O_2$ mixture would be an alternative to all of the above wet etching solutions. After this wet or plasma etch, only the areas of the metal layer 1 having been exposed to X-rays (structures 6 of silicide) remain on top of the silicon layer 2.

Figure 1D:
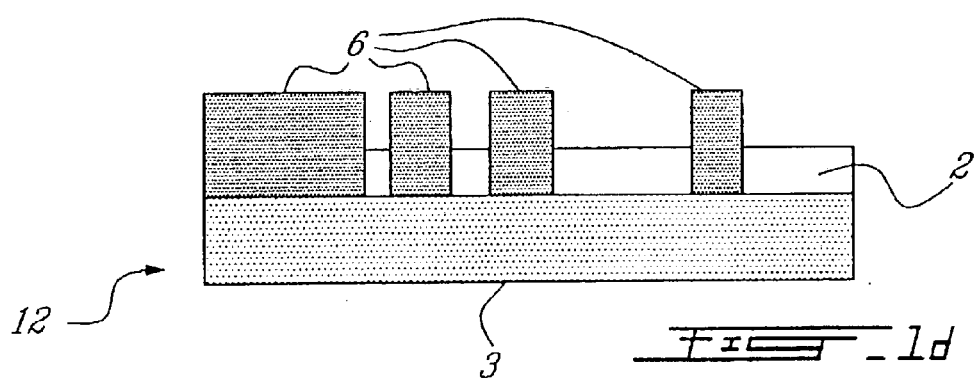
FIG. 1d is a side elevational view of the substrate of FIGS. 1a, 1b and 1c, in which the areas of the metal layer not protected by the structures of metal/semiconductor compound have been etched.

FIG. 1e:

The sample 12 of FIG. 1d is immersed in an acid solution or is processed in a plasma etching system for etching the silicon layer 2 while leaving the structures 6 of silicide intact. $CF_4:O_2$ is a proper gas mixture to perform this task by plasma etching. Alternatively, a solution of $HF:H_2O_2:H_2O$ can be used as etching acid solution. Following the wet or plasma etch, only the areas of the layer 2 of silicon having been exposed to X-rays (structures 6 of silicide) remain on the substrate 3.

Figure 1E:
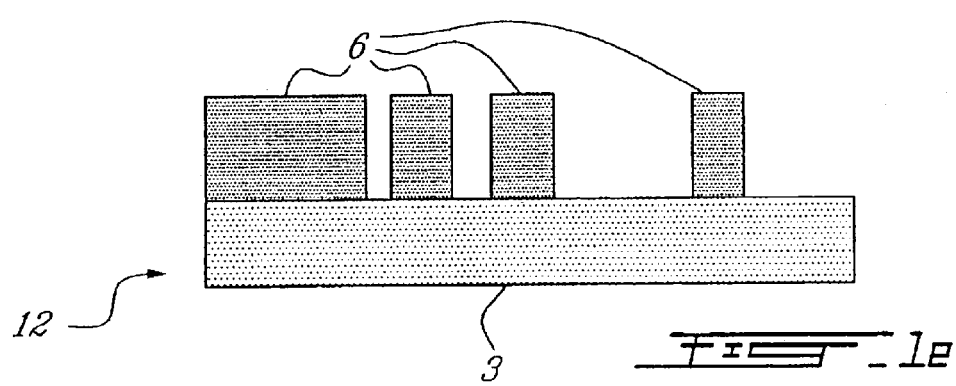
FIG. 1e is a side elevational view of the substrate of FIGS. 1a, 1b, 1c and 1d, in which the areas of the semiconductor layer not protected by the structures of metal/semiconductor compound have been etched to leave on the substrate only patterns of metal/semiconductor compound.
Figure 1F:
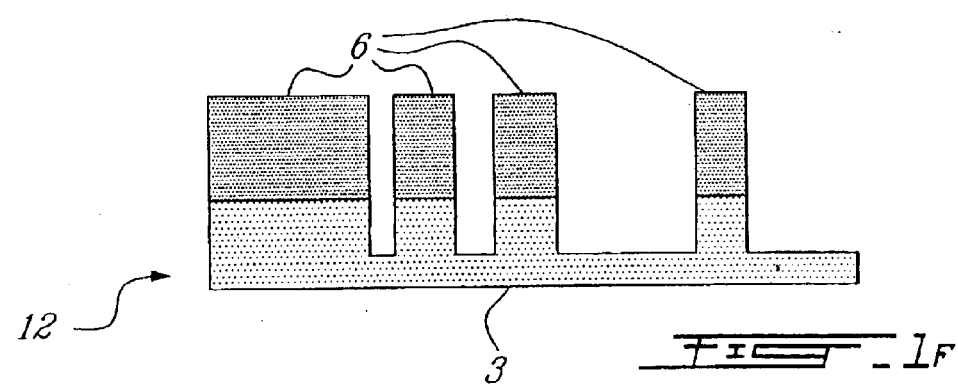
FIG. 1f is a side elevational view of the substrate of FIGS. 1a, 1b, 1c, 1d and 1e, in which the substrate has been etched through a part of its thickness except in regions protected by the structures of metal/semiconductor compound.

FIG. 1f:

The sample 12 of FIG. 1e is immersed in an acid solution or is placed in a plasma etching system to etch through a part of the thickness of the substrate 3 while leaving intact both the structures 6 of suicide and the areas of the substrate 3 underneath these structures 6 of silicide. The proper acid solution or gas plasma to perform this task depends on the nature of the substrate 3. In the case of a tantalum or polycrystalline silicon substrate, $CF_4:O_2$ can be used as gas mixture to perform the plasma etch. In the case of a chromium substrate, a solution of $HClO_4:H_2O:(NH_4)_2Ce(NO_3)_6$ can be used as etching acid solution.

FIG. 2 is an alternative to the set-up of FIG. 1b.

In the set-up of FIG. 2, a source 17 of extreme ultraviolet (EUV) radiation 11 is used to locally alloy the layer 1 of metal and the layer 2 of silicon. In this set-up, the mask 18 comprises a substrate 14 having one EUV reflective face 13 on which EUV absorbing patterns 15 are formed. This mask 18 is interposed between the source 17 and the sample 12 constituted by the substrate 3, the metal layer 1 and the silicon layer 2. As illustrated in FIG. 2, the reflective substrate 14 extends generally perpendicular to the sample 12 and the EUV radiation 11 is projected at an angle on the face 13. The latter angle is selected so that the EUV radiation 16 reflected from the face 13 is projected onto the layer 1 of metal of the sample 12. As can be appreciated, the EUV radiation 16 reflected from the surface 13 is patterned by the patterns 15. The energy of the EUV radiation 16 is absorbed at least in part by the layer 1 of metal. The energy of the EUV radiation absorbed by the metal layer 1 enables diffusion of the metal 1 and silicon 2 layers in each other to form the structures 6 of silicide.

Of course, the EUV lithography system of FIG. 2 may further include elements (not shown) such as reflective lenses to introduce a reduction or enlargement factor between the original patterns 15 and the copy (silicide structures 6). These lenses are usually made of a parabolic substrate covered by a stack of molybdenum and silicon layers with reflective properties.

Just a word to mention that the source of X-ray 7 or EUV 17 radiation may be a synchrotron, a plasma source, a laser source, or a source using a laser to excite a light emitting material. The wavelength of the photons from the source 7, 17 is chosen to have sufficient energy absorption in the metal layer 1 for the process to form an etch-resistant metal/semiconductor compound.

Deposition of the layer 1 of metal on top of the layer 2 of silicon can, in some instance, cause formation of some silicide residues at the metal/silicon interface. Such undesirable silicide residues can be removed using a wet etching solution. A chemical etch solution containing an acid such as $HF:H_2O_2:H_2O$ or $HNO_3:HF:H_2O$ can be used for that purpose.

According to an alternative, the layer 1 of metal can be first deposited on the previously cleaned substrate 3. The layer 2 of silicon can then be deposited on the layer 1 of metal. Again the metal of the layer 1 must be capable of reacting with the semiconductor of the layer 2 to form metal/semiconductor compound. An electron beam evaporation technique or a sputtering technique in a low vacuum chamber can still be used for depositing both layers 1 and 2. The same operations as described hereinabove can then be used to form the structures of metal/semiconductor compound. The subsequent etching techniques are also the same.

The above described resistless lithography method constitutes a high resolution technique capable of producing a structure of etch-resistant metal/semiconductor compound on a substrate with linewidths below 50 nm.

EXAMPLES

Example 1

X-Ray Mask Copying

In a first example, the method according to the present invention will be applied to the copying of a X-ray mask.

A blank membrane of silicon carbide, is cleaned by using an acetone bath, followed by an isopropyl alcohol bath, and then rinsed in water. The membrane is held flat and rigid by a ring of silicon. First, a 50 nm thick layer of chromium is deposited by sputtering on the surface of this membrane, followed by a 500 nm thick layer of tantalum. Afterward, a 20 nm thick layer of silicon is deposited on the layer of tantalum by cold sputtering, using helium as a plasma gas in order to reduce the sputtering rate and therefore reduce the grain size of the silicon layer. A 20 nm thick layer of nickel is deposited on top of the silicon layer, also using cold sputtering with helium as the plasma gas. The grain size that can be achieved using this technique is smaller than 10 nm for both the silicon and the nickel layer. This grain size is one of the factors limiting the resolution of the process and therefore, a grain size greater than the resolution required for the process would be inadequate.

The top nickel layer is exposed to X-ray radiation by means of a set-up corresponding to FIG. 1b. This X-ray radiation has a wavelength in the range of 0.5 to 1.5 nm. The X-ray radiation propagates through a mask such as 8 in FIG. 1b, made of a silicon carbide substrate 4 with X-ray absorbing patterns 5 formed of 500 nm thick layer of tantalum. Within this range of wavelengths, 80% of the X-ray radiation propagating through the tantalum patterns 5 are absorbed. The patterns are therefore imparted in negative tone on the surface of the nickel layer. The areas of the nickel layer exposed to X-ray radiation form a silicide with the underlying silicon layer. Approximately 40% of the energy of the X-ray radiation is absorbed in the 20 nm nickel layer. The absorbed energy induces the reaction that forms the structures of silicide at the nickel/silicon interface.

The silicide being etch-resistant; it is then possible to remove by wet etching the unexposed regions of the nickel layer, leaving the silicide structures intact. A $HNO_3:CH_3CHOHCH_3:H_2O$ (5:2:50) solution at room temperature is a proper acid to perform this etch.

The silicon layer can also be etched, except in the areas in which silicide structures have been formed, using a $HF:H_2O_2:H_2O$ (3:1:300) acid solution.

Once the layer of silicon is removed, only the silicide structure is left over the tantalum layer. A directional etching by a $CF_4$ plasma in a reactive ion etching system is used to transfer the patterns to the tantalum layer. In such a system, $CF_4$ gas molecules are excited to ionic state, making them very reactive with tantalum. The reactive ions are also accelerated perpendicular to the surface of the substrate, in order for the etched sidewalls to be vertical. Nickel silicide has an excellent resistance to $CF_4$ plasma etching, which allows the silicide structures to adequately protect the tantalum layer during the etch. In the regions of the tantalum layer not protected by the silicide structures, the tantalum layer is completely removed and the chromium layer acts as an etch stop to prevent the plasma from damaging the silicon carbide membrane.

The chromium layer can be removed by using a standard $HClO_4:H_2O:(NH_4)_2Ce(NO_3)_6$ wet etching solution, except in the areas protected by the silicide structures.

The resulting mask is a negative tone copy of the original mask such as 8 in FIG. 1b. An exact copy of the original mask can be obtained by copying the result of the first generation copy obtained through this same process. In this case, the result will be a negative tone of the negative tone copy, thus an exact copy of the original.

Other absorbent materials can be used in the place of tantalum, both in the original and the copied mask. This absorbent material can be chosen from a group that comprises tantalum, tungsten, TaSi, WSi, $Ta_4B$ and $W_4B$, TaGe, TaReGe and WTi.

Example 2

EUV Mask Copying

In a second example, the method in accordance with the present invention will be applied to the copying of a EUV mask.

A blank substrate, composed of a stack of 81 alternating layers of molybdenum and silicon, with individual layer thickness of 2.8 nm for the molybdenum layers and 4.0 nm for the silicon layers, is prepared by cold sputtering on a clean silicon wafer. This alternating stack of layers is reflective for extreme ultraviolet wavelengths in the range of 10 to 20 nm, with a reflectivity peak around 13.4 nm. A 20 nm thick chromium layer is deposited by sputtering on this substrate, followed by a 40 nm thick $SiO_2$ layer and a 100 nm thick tantalum layer. Afterward, 20 nm thick silicon and nickel layers are deposited on top of the tantalum layer using cold sputtering to limit the grain size and prevent the diffusion of each layer into the other layer through heating of the substrate.

The top nickel layer is exposed to EUV radiation by means of a set-up corresponding to FIG. 2, using a source 17 which generates an EUV radiation at a wavelength in the range of 10 to 20 nm. The EUV radiation 11 from the source is reflected by a mask 18 made of a substrate 14 with an EUV reflective face 13. EUV absorbing patterns 15 are formed on the face 13 using a 100 nm thick layer of tantalum. The patterns 15 are transferred or imparted to the EUV radiation 16 reflected from the reflective face 13 and are projected in negative tone on top of the nickel layer. The areas of the nickel layer exposed to the EUV radiation 16 form structures of silicide with the underlying silicon layer. More specifically, the energy of the photons absorbed by the top nickel layer induces the reaction by which is induced the formation of the structures of silicide at the nickel/silicon interface.

The silicide being etch-resistant, it is then possible to remove by wet etching the unexposed regions of the nickel layer, leaving the silicide structures intact. A $HNO_3:CH_3CHOHCH_3:H_2O$ (5:2:50) solution at room temperature is a proper acid to conduct this etch.

The 20 nm thick silicon layer can also be etched, except in the areas in which silicide-structures have been formed, using a $HF:H_2O_2:H_2O$ (3:1:300) acid solution. Once this layer of silicon is removed, only the silicide structures are left over the tantalum layer.

A directional etching by a $CF_4$ plasma in a reactive ion etching system is used to transfer the patterns to the tantalum and $SiO_2$ layers. In such a system, $CF_4$ gas molecules are excited to ionic state, making them very reactive with tantalum and silicon atoms. Nickel silicide has an excellent resistance to $CF_4$ plasma etching, which allows the silicide structures to adequately protect the tantalum and $SiO_2$ layers during the etch. In the regions not protected by the suicide structures, the tantalum and $SiO_2$ layers are completely removed and the chromium layer acts as an etch stop to prevent the plasma from damaging the reflective stack of alternating molybdenum and silicon layers.

The chromium layer can be removed by means of a standard $HClO_4:H_2O:(NH_4)_2Ce(NO_3)_6$ wet etching solution, except in the areas protected by the silicide structures.

The resulting EUV mask is a negative tone copy, and an exact copy of the original can be obtained by copying again this negative tone copy.

Other EUV absorbing materials can be used in the place of tantalum, both in the original and the copied masks. This EUV absorbing material can be chosen from a group that comprises tantalum, tantalum silicide, tungsten, tungsten silicide, $TaB_4$ and $WB_4$, TaSiN, chromium, nickel and nickel silicide.

Example 3

Integrated Circuit Components

In a third example, the method in accordance with the present invention will be applied to the fabrication of MOS transistor gates.

The substrate is a wafer of silicon which previously underwent several steps of fabrication, including gate oxide fabrication using conventional micro-fabrication. For transistor gate fabrication, a 30 nm polycrystalline silicon layer is deposited on top of the wafer by low pressure chemical vapor deposition, using $SiH_4$ as the main reactive gas. A 50 nm chromium layer is then deposited by electron gun evaporation on top of the polycrystalline silicon layer. The top chromium layer is exposed, in a set-up corresponding to FIG. 1b, to X-ray radiation having a wavelength situated in the range of 0.5 to 1.5 nm. The X-ray radiation is produced by a source 7 (FIG. 1b) and propagates through a mask 8 made of a silicon carbide substrate 4 formed with a 500 nm thick X-ray absorbing patterns 5 of tantalum. The patterns 5 of tantalum on the substrate 4 corresponds to the gates of the transistors in negative tone. The patterns 5 are projected on the surface of the 50 nm thick chromium layer. The areas of the chromium layer exposed to X-ray radiation form silicide structures with the underlying 30 nm thick polycrystalline silicon layer. The chromium layer absorbs an important part of the energy of the X-ray radiation, and this absorbed energy induces the reaction responsible for the formation of the silicide structures at the nickel/silicon interface.

Since the silicide structures are etch-resistant, it is then possible to remove by wet etching the unexposed regions of the nickel layer, leaving the silicide structures intact. A solution of $HClO_4:H_2O:(NH_4)_2Ce(NO_3)_6$ at room temperature is a proper acid to perform this etch.

The polycrystalline silicon layer can then be removed either by using a controlled plasma etching using $SF_6$ gas to form the plasma, or a conventional polycrystalline silicon wet etching solution such as $HF:HNO_3:H_2O$.

The resulting gates are made of chromium silicide, which presents a greater conductivity than the polycrystalline silicon used for the fabrication of gates in conventional processes. This would be an advantage over the conventional method, especially for MOS transistors operating at high frequencies where the limited conductivity of polycrystalline silicon is a limitation. This method does not require a resist to fabricate the gates, which allows a better resolution (only limited by the grain size of the metal deposition). The fabrication of a metal silicide gate is also compatible with the conventional fabrication processes for other elements of integrated circuits.

Several other metals can be used to form the silicide with the polycrystalline silicon layer. The criteria for choosing this metal are the compatibility with the MOS process, the ability to absorb X-rays, and the chemical selectivity of the metal layer in regard of the silicide formed with the underlying polycrystalline silicon layer.

Example 4

Micro-Machining Applications

The method according to the present invention has also applications to the micro-fabrication of electrical and/or mechanical elements. As an example, a 50 nm silicon layer and a 50 nm nickel layer are deposited by electron gun evaporation on top of a substrate containing a 5000 nm thick layer of SiC over a 500 nm thick sacrificial layer of glass.

The top nickel layer is exposed to X-ray radiation through a set-up corresponding to FIG. 1b. A source 7 (FIG. 1b) generates X-ray radiation 9 having a wavelength in the range of 0.5 to 1.5 nm. The X-ray radiation 9 propagates through the mask 8 made of a silicon carbide substrate 4 with X-ray absorbing patterns 5 made of 500 nm thick layer of tantalum. In this particular example, the patterns 5 represents the electrical and/or mechanical micro-elements. The patterns 5 are therefore projected in negative tone on the surface of the nickel layer. As explained hereinabove, the areas of the nickel layer exposed to X-ray radiation form silicide structures with the underlying silicon layer.

Since the silicide is etch-resistant, it is then possible to remove by wet etching the unexposed regions of the nickel layer, leaving the silicide structures intact. A HNO$_3$:CH$_3$CHOHCH$_3$:H$_2$O (5:2:50) solution at room temperature is a proper acid to perform the latter etch.

The 50 nm thick silicon layer can also be etched, except in the areas protected by the silicide structures, using a HF:H$_2$O$_2$:H$_2$O (3:1:300) acid solution.

Once the layer of silicon is removed, only the silicide structure is left over the SiC layer. A directional etching by a SF$_{6:O2}$ plasma in a reactive ion etching system is used to transfer the patterns to the SiC layer by chemically removing this layer except in the regions protected by the silicide structures. The reactive ions are accelerated perpendicular to the surface of the substrate, in order for the etched sidewalls to be vertical. In the regions of the SiC layer not protected by the silicide structures, this SiC layer is completely removed down to the sacrificial glass layer. This glass layer can be completely removed using a strong HF solution. If left long enough in the HF solution, the glass material (SiO$_2$) will dissolve completely, including the portions located underneath the patterned SiC micro-elements. These micro-elements will therefore separate themselves partly or completely from the glass layer, and can afterward be manipulated independently and assembled to form a mechanism.

Figure 3:
FIG. 3 is a micrograph showing nickel suicide patterns formed through the use of X-ray radiation to transfer patterns from a mask to a substrate.

Just a word to mention that FIG. 3 is a micrograph showing nickel silicide structures (squares) for using X-rays to transfer the patterns from a mask (grid) to a silicon substrate.

FIG. 4 is a X-ray micro-analysis of silicide structures formed using the method of the invention compared to the initial nickel film over the silicon layer. Due to the limitation in depth resolution of X-ray analysis, the underlying silicon layer is visible in the initial nickel film.

An advantage of the present invention over conventional processes using organic resists is that it enables a very high resolution in the fabrication of these micro-elements. This resolution can be achieved in part because of the excellent selectivity of some metal silicides such as nickel silicide over Si and SiC in a fluoride plasma. Such a selectivity allows to perform deep directional etches in Si or SiC without the necessity of a thick etch mask. 100 nm thick silicide structures should be sufficient to protect adequately Si and SiC patterns in layers as thick as 5 micrometers without suffering from the wear that often destroys the photon sensitive resists currently used for the same purpose.

Although the present invention has been described hereinabove by way of preferred embodiments thereof, it can be modified at will within the scope of the appended claims, without departing from the spirit and nature of the subject invention.

What is claimed is:

1. A lithography method for fabricating on a substrate structures of etch-resistant metal/semiconductor compound, comprising:
   depositing on the substrate superposed layers of metal and semiconductor capable of reacting with each other to form the etch-resistant metal/semiconductor compound;
   producing radiation through a radiation source;
   interposing between the radiation source and the superposed metal and semiconductor layers a mask defining radiation-absorbing patterns;
   propagating the radiation from the source to the mask where the patterns absorb radiation and, therefore, said patterns are imparted to said radiation; and
   propagating the patterned radiation from the mask to the superposed metal and semiconductor layers where energy of said patterned radiation is absorbed locally by the metal and semiconductor layers to (a) induce the reaction between the metal and semiconductor responsible for the formation of etch-resistant metal/semiconductor compound, and (b) thereby produce the structures of etch-resistant metal/semiconductor compound corresponding to the patterns imparted to said radiation.

2. A method as defined in claim 1, wherein depositing the metal and semiconductor layers comprises:
   depositing the semiconductor layer on the substrate; and
   depositing the metal layer on the semiconductor layer.

3. A method as defined in claim 1, wherein depositing the metal and semiconductor layers comprises:
   depositing the metal layer on the substrate; and
   depositing the semiconductor layer on the metal layer.

4. A method as defined in claim 1, wherein said radiation is an X-ray radiation.

5. A method as defined in claim 4, wherein:
   said mask comprises an X-ray transparent substrate including X-ray absorbing patterns forming said radiation-absorbing patterns; and
   said method comprises propagating the X-ray radiation through the X-ray transparent substrate.

6. A method as defined in claim 1, wherein said radiation is an extreme ultraviolet radiation.

7. A method as defined in claim 6, wherein:
   said mask comprises an extreme ultraviolet reflective substrate including extreme ultraviolet absorbing patterns forming said radiation-absorbing patterns; and
   said method comprises reflecting the extreme ultraviolet radiation from the source on the extreme ultraviolet reflective substrate toward the metal and semiconductor layers.

8. A method as recited in claim 1, wherein said mask comprises a substrate transparent to said radiation and including the radiation-absorbing patterns, said method comprising propagating the radiation through the radiation transparent substrate.

9. A method as recited in claim 1, wherein said mask comprises a radiation reflective substrate including the radiation-absorbing patterns, said method comprising reflecting said radiation from the source on the radiation reflective substrate toward the metal and semiconductor layers.

10. A method as recited in claim 1, wherein the semiconductor is selected from the group consisting of silicon, germanium, a combination of silicon and germanium, gallium, arsenic, aluminium, phosphor, indium, and any combination of gallium, arsenic, aluminium, phosphor and indium.

11. A method as recited in claim 1, wherein the metal is selected from the group consisting of titanium, zirconium, hafnium, vanadium, niobium, tantalum, chromium, molybdenum, tungsten, manganese, iron, cobalt, rhodium, iridium, nickel, palladium, platinum, copper, silver, zinc, and cadmium.

12. A method as defined in claim 1, wherein the substrate is made of a material selected from the group consisting of tantalum, polycrystalline silicon, and chromium.

13. A method as defined in claim 1, wherein the substrate is made of a material selected from the group consisting of metal, semiconductor material, insulator material, and a combination thereof.

14. A method as defined in claim 1, wherein the semiconductor comprises silicon, and the metal/semiconductor compound comprises silicide.

15. A method as defined in claim 1, further comprising:
- etching the metal layer while leaving the structures of etch-resistant metal/semiconductor compound intact; and
- etching the semiconductor layer while leaving the structures of etch-resistant metal/semiconductor compound intact.

16. A method as defined in claim 15, further comprising:
- etching the substrate except in regions protected by the structures of etch-resistant metal/semiconductor compound to thereby transfer said patterns from the structures of etch-resistant metal/semiconductor compound to the substrate.

17. A method as defined in claim 16, wherein said etching comprises wet etching.

18. A method as defined in claim 16, wherein said etching comprises plasma etching.

19. A method as defined in claim 15, further comprising:
- etching through a portion of the thickness of the substrate except in regions protected by the structures of etch-resistant metal/semiconductor compound to thereby transfer said patterns from the structures of etch-resistant metal/semiconductor compound to the substrate.

20. A method as defined in claim 15, wherein:

the substrate comprises a plurality of layers; and said method further comprises etching through at least one layer of the substrate except in regions protected by the structures of etch-resistant metal/semiconductor compound to thereby transfer said patterns from the structures of etch-resistant metal/semiconductor compound to said at least one layer of the substrate.

21. A method as defined in claim 15, wherein said etching comprises wet etching.

22. A method as defined in claim 15, wherein said etching comprises plasma etching.

* * * * *